US006942730B2

(12) United States Patent
Han

(10) Patent No.: US 6,942,730 B2
(45) Date of Patent: Sep. 13, 2005

(54) HYBRID STOCKBARGER ZONE-LEVELING MELTING METHOD FOR DIRECTED CRYSTALLIZATION AND GROWTH OF SINGLE CRYSTALS OF LEAD MAGNESIUM NIOBATE-LEAD TITANATE (PMN-PT) SOLID SOLUTIONS AND RELATED PIEZOCRYSTALS

(75) Inventor: Pengdi Han, Renton, WA (US)

(73) Assignee: H. C. Materials Corporation, Urbana, IL (US)

( * ) Notice: Subject to any disclaimer, the term of this patent is extended or adjusted under 35 U.S.C. 154(b) by 52 days.

(21) Appl. No.: 10/288,042

(22) Filed: Nov. 4, 2002

(65) Prior Publication Data

US 2003/0164137 A1 Sep. 4, 2003

Related U.S. Application Data

(60) Provisional application No. 60/330,915, filed on Nov. 2, 2001.

(51) Int. Cl.[7] .................................................. C30B 11/14
(52) U.S. Cl. .............................. 117/81; 117/82; 117/83; 117/223
(58) Field of Search ............................... 117/81, 82, 83, 117/223

(56) References Cited

U.S. PATENT DOCUMENTS

| | | | |
|---|---|---|---|
| 3,696,038 A | * 10/1972 | Davies et al. .................. 117/82 |
| 4,109,359 A | 8/1978 | Cross et al. ................ 29/25.35 |
| 4,313,839 A | 2/1982 | Fesenko et al. ............. 252/62.9 |
| 4,613,784 A | 9/1986 | Haun et al. .................. 310/358 |
| 4,658,176 A | 4/1987 | Nakaya et al. .............. 310/334 |
| 4,683,396 A | 7/1987 | Takeuchi et al. ............ 310/358 |
| 4,728,845 A | 3/1988 | Haun et al. .................. 310/358 |
| 5,295,487 A | 3/1994 | Saitoh et al. |
| 5,345,139 A | 9/1994 | Gururaja et al. |
| 5,402,791 A | 4/1995 | Saitoh et al. |
| 5,539,965 A | 7/1996 | Safari et al. .................... 29/25 |
| 5,790,156 A | 8/1998 | Mutton et al. ................. 347/71 |
| 5,804,907 A | 9/1998 | Park et al. ................... 310/358 |
| 5,935,485 A | 8/1999 | Tani et al. .................. 252/62.9 |
| 5,945,030 A | 8/1999 | Kimura et al. ............. 252/62.9 |
| 5,998,910 A | 12/1999 | Park et al. ................... 310/358 |
| 6,020,675 A | 2/2000 | Yamashita et al. .......... 310/358 |
| 6,048,394 A | 4/2000 | Harmer et al. ................. 117/8 |
| 6,465,937 B1 | 10/2002 | Chen et al. .................. 310/360 |
| 6,554,895 B2 * | 4/2003 | Duffar et al. ................. 117/82 |
| 2001/0035123 A1 | 11/2001 | Lee et al. ....................... 117/3 |
| 2002/0036282 A1 | 3/2002 | Chiang et al. ............. 252/62.9 |

FOREIGN PATENT DOCUMENTS

CN          1227286          9/1999

OTHER PUBLICATIONS

J. Kuwata, K. Uchino and S. Nomura, Dielectric and piezo-electric properties of 0.91pb(Zn1/3Nb2/3)O3–0.09PbTiO3, Jpn. J. Appl. Phys., 21, 1298–1302 (1982).

S.E. Park and T.R. Shrout, Characteristics of Relaxor–Based Piezoelectric single crystal for ultrasonic transducers, IEEE Trans. On Ultrasonics, Ferroelectrics and Frequency Cotrol, vol. 44, No. 5, 1140–1147 (1997).

(Continued)

Primary Examiner—Robert Kunemund
(74) Attorney, Agent, or Firm—Andrew F. Young, P.C.

(57) ABSTRACT

This invention provides a hybrid Stockbarger zone-leveling melting method for seeded crystallization and the manufacture of homogenous large-sized crystals of lead magnesium niobate-lead titanate (PMN-PT) based solid solutions and related piezocrystals. The invention provides three temperature zones resulting in increased compositional homogeneity and speed of crystal growth, in a cost effective multi-crucible configuration.

6 Claims, 10 Drawing Sheets

OTHER PUBLICATIONS

T. Kobayashi, S. Shimanuki, S. Saitoh, and Y. Yamashita, Improved growth of large lead zinc niobate titanate piezoelectric single crystals for medical ultransonic transducers, Jpn. J. Appl. Phys., 36, 6035–38 (1997).

Y. Hosono, K. Harada, S. Shimanuki, S. Saitoh, and Y. Yamashita, Crystal growth and mechanical properties of Pb(Zn1/3Nb2/3)O3–PbTiO3 single crystal produced by solution Bridgman method, Jpn. J. Appl. Phys., 38, 5512–15 (1999).

S.E. Park and T.R. Shrout, Ultrahigh strain and piezoelectric behavior in relaxtor based ferroelectric single crystals, J. Appl. Phys., 82, 1804–11 (1997).

H. Luo, G. Xu, H. Xu, P. Wang, and Z. Yin, Compositional homogeneity and electrical properties of lead magnesium niobate titanate single crystals grown by a modified Bridgman technique, Jpn. J. Appl. Phys., 39, 5581–85 (2000).

T.R. Shrout, Z.P. Chang, N. Kim and S. Markgraf, Dielectric behavior of single crystals near the (1–x) Pb(Mg1/3Nb2/)O3–xPbTiO3 Morphotropic Phase Boundary, Ferroelectrics Lett., 12, 63–69 (1990).

P. Yang, J. Liao, et al, Growth of large–size crystal of PbWO, by vertical bridgman method of multiple crucibles, J. Of Cryst. Growth 236 (2002) 589–595.

S. Yin and H. Lou, Recent Progress of Study on Growth Process of Pmnt Single Crystals in Shanghai Inst. Of Ceramics, Pub. Laboratory of Functional Inorganic, Pub Unknown, Date and Pages Unknown. (Copy supplied).

Z. G. Ye, P. Tissot, and H. Schmid, Pseudo–Binary Pb($Mg_{1/3}$ $Nb_{2/3}$)$O_3$–PbO Phase Diagram and Crystal Growth of Pb($Mg_{1/3}Nb_{2/3}$)$O_3$ [PMN], Mat. Res. Bull., vol. 25, pp. 739–748, 1990.

* cited by examiner

HYBRID STOCKBARGER ZONE-LEVELING MELTING METHOD FOR DIRECTED CRYSTALLIZATION AND GROWTH OF SINGLE CRYSTALS OF LEAD MAGNESIUM NIOBATE-LEAD TITANATE (PMN-PT) SOLID SOLUTIONS AND RELATED PIEZOCRYSTALS

RELATED APPLICATIONS

This application claims priority from U.S. Provisional Application Ser. No. 60/330,915, filed Nov. 2, 2001, and said U.S. Provisional Application is incorporated herein by reference.

GOVERNMENT SPONSORSHIP

This invention was made with Government support under Grant No. N00014-99-C-0367 and N00014-00-C-0436 awarded by the Office of Navy Research. The government has certain rights in the invention.

BACKGROUND OF THE INVENTION

1. Field of the Invention

The present invention relates to a method for ceramic crystallization and growth. More specifically, the present invention relates to a crystal growth method based upon a hybrid Stockbarger zone-leveling melting system for seeded and unseeded crystallization providing zone-melting function and more particularly for the manufacture of large-sized crystals of lead magnesium niobate-lead titanate (PMN-PT) solid solutions and related piezocrystals by doping.

2. Description of the Related Art

Acoustic transducers are the operational center of many medical and commercial imaging systems. The most common types of transducers utilize lead zirconate titanate (PZT) based ceramics as a piezoelectric function. Piezoelectric ceramics convert mechanical energy into electrical energy and conversely electrical energy into mechanical energy. While conventional PZT materials remain the most common materials used in acoustic transduction devices, changing material requirements have fostered the need for new piezoelectric materials having improved dielectric, piezoelectric and mechanical properties.

Single crystals of solid solutions of $Pb(Mg_{1/3}Nb_{2/3})O_3$ (PMN) and $Pb(Zn_{1/3}Nb_{2/3})O_3$ (PZN) with $PbTiO_3$ (PT) (PMN-PT and PZN-PT) have generally desirable ultrahigh piezoelectric properties, coupling constants ($k_{33}$), and dielectric constants that are unachievable in conventional piezoelectric (PZT) ceramics.

At ambient temperatures, the morphotropic phase boundary (MPB), separating rhombohedral phase from tetragonal phase, exists in (1−x)PMN-xPT system at about x=0.34, and in (1−x)PZN-xPT system at about x=0.09. The crystals of compositions close to the MPB, the so-called relaxor-based single crystals, have shown greatly desired piezoelectric properties suitable for use in medical imaging devices. Unfortunately, the electromechanical properties of these types of single crystals are very sensitive to the orientation and chemical composition of the crystal (See for example U.S. Pat. No. 6,465,937), and have been very hard to produce in reliable and homogenous quantities.

In early 1980s, Kuwata et al. (J. Kumata, K. Uchino and S. Nomura, *Dielectric and piezoelectric properties of* $0.91Pb(Zn_{1/3}Nb_{2/3})O_3$-$0.009PbTiO_3$, Jpn. J. Appl. Phys., 21, 1298–1302 (1982)) found very high piezoelectric coefficient, $d_{33}$, of 1500 pC/N and electromechanical coupling factor, $k_{33}$, of 0.92 in 0.91PZN-0.09PT single crystals along <001> direction.

Later, high properties were also observed in PMN-PT crystals by Shrout and his co-workers in 1990 (T. R. Shrout, Z. P. Chang, N. Kim and S. Markgraf, *Dielectric behavior of single crystals near the* (1−x) $Pb(Mg_{1/3}Nb_{2/3})O_3$-$xPbTiO_3$ *Morphotropic Phase Boundary*, Ferroelectrics Lett, 12, 63–69 (1990)).

High electromechanical coupling ($k_{33}$)>90%, piezoelectric coefficient ($d_{33}$)>2500 pC/N and large strain up to 1.7% were reproducibly observed in the later 1990's (S. E. Park and T. R. Shrout, *Ultrahigh strain and piezoelectric behavior in relaxor based ferroelectric single crystals*, J. Appl. Phys., 82, 1804–11 (1997)).

The super-high piezoelectric properties noted in this literature promised a new generation of acoustic transduction devices.

The small single crystals of PMN-PT and PZN-PT discovered above were obtained by a flux growth method. Unfortunately, usefully sized single crystals (inch size) of good quality were long unavailable until in 1997 when PZN-PT single crystals were grown by improved flux growth methods. See S. E. Park and T. R. Shrout, *Characteristics Of Relaxor-Based Piezoelectric Single Crystal For Ultrasonic Transducers*, IEEE Trans. On Ultrasonics, Ferroelectrics and Frequency Control, Vol. 44, No. 5, 1140–1147 (1997); and T. Kobayashi, S. Shimanuki, S. Saitoh, and Y. Yamashita, *Improved Growth Of Large Lead Zinc Niobate Titanate Piezoelectric Single Crystals For Medical Ultrasonic Transducers*, Jpn. J. Appl. Phys., 36, 6035–38 (1997).

A Bridgman method (P. W. Bridgman, Proc. Am. Acad. Sci. 60 9 (1925) 303) is characterized by a relative translation of a crucible containing a melt along a single axial temperature gradient in a vertical furnace. A Stockbarger method (D. C. Stockbarger, Ref. Sci. Instrum. 7 (1963) 133) is a modification of the Bridgman method and employs a single heat insulation buffer separating a vertical furnace into only two zones, a high temperature zone and an upper low-temperature zone.

Recently, a modified vertical Bridgman growth method was developed for large sized crystals: PZN-PT single crystals associated with flux (Y. Hosono, K. Harada, S. Shimanuki, S. Saitoh, and Y. Yamashita, *Crystal Growth And Mechanical Properties Of* $Pb(Zn_{1/3}Nb_{2/3})O_3$-$Pbtio_3$ *Single Crystal Produced By Solution Bridgman Method*, Jpn. J. Appl. Phys., 38, 5512–15 (1999)) and PMN-PT single crystals using a crucible moving-downward method in a broad 2-zone temperature gradient (Chinese Pat. No. CN 1227286A, "Method Of Preparation Of Relaxor Ferroelectric Single Crystal Lead Magnesium Niobate-Lead Titanate" by H. Luo et al., published Sep. 1, 1999 and H. Luo, G. Xu, H. Xu, P. Wang, and Z. Yin, *Compositional Homogeneity And Electrical Properties Of Lead Magnesium Niobate Titanate Single Crystals Grown By A Modified Bridgman Technique*, Jpn. J. Appl. Phys., 39, 5581–85 (2000)).

Unfortunately, substantial challenges still exist in manufacturing piezoelectric single crystals. One challenge is that a lead-contained melt, at high temperature, is made highly toxic through the evaporation of lead oxide and increases compositional segregation detrimentally. This challenge alone eliminates most commercially available crystal growth techniques. Further, the electromechanical properties of the relaxor-based PMN-PT crystals with 25~35% PT contents close to the MPB are critically sensitive to the PT content. An additional challenge is that crystal growth with flux association yields a very low growth rate and unacceptable imperfection manifestations, including micro inclusions. Finally, each of these methods provides poor homogeneity and greatly reduced material utilization factors raising production costs.

It is also clear that the Bridgman-type growth method alone is only feasible for PMN-PT crystal due to the pseudo-congruent behavior of the binary solid solution system. So far no publications gave the reason for this behavior and there is no calculable way to predict it due to the absence of most important of the thermodynamic parameters. (Only the experimental results, presented herein indicate the crystallization behavior)

Referring now to FIGS. 1(A) and 1(B), the Bridgman growth method allows for PMN-PT crystal growth at relatively fast rates, up to 1 mm/hr, but the resultant compositional segregation is detrimentally large. The PT variability provides unpredictable and undesirable piezoelectric properties reducing material utilization to a vary small range. The resultant compositional segregations prevent commercial implementation of rapid growth rates without unacceptably high quality control losses.

Referring now to FIG. 2, single PMN-PT crystals grown using solely the Bridgman growth method resulted in great Pb, Mg, Nb, and Ti variability along the length of the boule. The growth parameters were: seeding [110], growth rate 0.8 mm/hr at temperature gradient 30° C./cm, and maximum crucible temperature of 1365° C. The Induction Coupled Plasma (ICP) spectroscopy employed had accuracy greater than 0.5%. It is clear from the figure that there is wide compositional variability along the length of the boule. This variability is drastically significant even within 1 cm length increments. It is clear that this method of crystal growth is incapable of providing useful lengths of compositionally homogenous material.

As noted above, since the piezoelectric properties of PMN-PT single crystals are sharply dependent upon composition, this composition variability results in a great reduction of the useful portion of the as-grown crystal boule, and increased production, handling, and testing costs. As seen in the figure, the % of each of the compositional changes is as much as 10–25% within 1 cm. This variability is unacceptable for commercial implementation.

In summary, the problems of commercially available manufacturing methods for PMN-PT single crystals include at least the following:
1. low unit yield and high manufacturing cost
2. gross compositional inhomogeneity resulting in variation of piezoelectric properties

OBJECTS AND SUMMARY OF THE INVENTION

An object of the present invention is to provide a hybrid Stockbarger zone-leveling melting method for directed crystallization growth providing a melting zone sandwiched by thermal barriers. In contrast, the Sockbarger or Bridgeman method have full melting above seed or grown crystal with no zone-melting.

Another object of the present invention is to provide a method for directed crystallization and growth of crystals of lead magnesium niobate-lead titanate (PMN-PT) solid solutions and related piezocrystals, which is both cost effective and commercially acceptable Another object of the present invention is to increase at least one of a quality and a reliability of production for large-sized crystals of lead magnesium niobate (PMN)-lead titanate (PT) based solid solutions and related piezocrystal.

Another object of the present invention is to provide a hybrid Stockbarger zone-leveling melting method for directed crystallization growth that achieves improved compositional homogeneity long the length of as-grown crystal boules.

Another object of the present invention is to provide a method enabling a multi-crucible configuration.

The present invention relates to a crystal growth method incorporating a hybrid Stockbarger zone melting-type crystal growth system with a precisely directed crystallization and a crystal growth process employing at least three thermal zones. More particularly, the present invention provides for the manufacture of large-sized crystals of lead magnesium niobate-lead titanate (PMN-PT) solid solutions and related piezocrystals. The merits (advantages) of the present crystal growth method are cost effectiveness produced through enabling a multi-crucible configuration and a significantly improved better compositional homogeneity along the length of as-grown boules. These results stem from employing a three zone-leveling function when compared to known Bridgman/Stockbarger crystal growth methods. The present crystal growth invention method may be used commercially to manufacture single crystals of lead magnesium niobate-lead titanate solid solutions and related piezocrystals by doping.

According to an embodiment of the present invention there is provided a crystal growth system, comprising: at least one vertical furnace, at least one means for inputting thermal energy in the vertical furnace, at least a first thermal boundary member adjacent a top side of the thermal in-put means, at least a second thermal boundary member adjacent a bottom side of the thermal in-put means, and the at least first and second thermal boundary members effective to divide the vertical furnace into at least one narrow high-temperature zone, at least one upper low-temperature zone, and at least one lower low-temperature zone during a use of the vertical furnace, whereby each the low-temperature zone has a lower temperature than the high-temperature zone.

According to another alternative embodiment of the present invention there is provided a crystal growth system, further comprising: an inner surface on the at least first and second thermal boundary members, at least one crucible assembly in the vertical furnace, an outer surface on the crucible assembly, and each the inner surface being a distance D less than about 15.0 mm from the outer surface during the use, whereby the thermal boundary members limit transfer of thermal energy along the outer surface into the upper and lower low-temperature zones during the use.

According to another alternative embodiment of the present invention there is provided a crystal growth system, further comprising: a ceramic member in the crucible assembly, the outer surface being an outer boundary of the ceramic member, a crucible in the crucible assembly, the crucible containing at least a batch material zone, a melting zone, and a as-grown crystal zone during the use, the melt zone adjacent the high-temperature zone during the use, and a ceramic powder between the crucible and the ceramic member, whereby the ceramic powder stabilizes the crucible within the ceramic member during the use.

According to another alternative embodiment of the present invention there is provided a crystal growth system further comprising: means for thermally monitoring at least a first temperature of the thermal in-put means, a second temperature of the crucible in the high-temperature zone, and a third temperature adjacent a base portion of the crucible, means for positioning the crucible assembly relative to the high-temperature zone during the use, the positioning means moving the crucible assembly relative to the high-temperature zone at a rate R between at least 0.2 and 10.0 mm/hr during the use, means for controlling and interfacing with the means for inputting, the means for positioning, and the means for thermally monitoring and operating the crystal growth system during the use.

According to another alternative embodiment of the present invention there is provided a crystal growth system, wherein, the distance D is preferably less than about 10 mm.

According to another alternative embodiment of the present invention there is provided a crystal growth system, wherein, the distance D is less than about 5 mm.

According to another alternative embodiment of the present invention there is provided a crystal growth system, wherein the rate R is preferably between at least 0.2 and 2.4 mm/hr during the use.

According to another alternative embodiment of the present invention there is provided a crystal growth system, wherein the rate R is more preferably between at least 0.2 and 2.0 mm/hr.

According to another alternative embodiment of the present invention there is provided a crystal growth system, wherein: a thermal gradient G within the high-temperature zone is from 10 to 50° C./cm.

According to another alternative embodiment of the present invention there is provided a crystal growth system, wherein the thermal gradient G is preferably from 10 to 40° C./cm.

According to another alternative embodiment of the present invention there is provided a crystal growth system, wherein a thermal gradient G1 within each the upper and the lower low-temperature zones is a negative thermal gradient.

According to another alternative embodiment of the present invention there is provided a crystal growth system, wherein the negative thermal gradient G1 is between at least about 20–100° C./cm.

According to another alternative embodiment of the present invention there is provided a crystal growth system, further comprising: a wall of the crucible, the wall extending from the lower low-temperature zone through the high-temperature zone and into both the upper low-temperature zone during the use, and a temperature T at the wall of the crucible adjacent the melting zone being less than 1375° C. during the use.

According to another alternative embodiment of the present invention there is provided a crystal growth system, wherein the temperature T is preferably less than 1360° C. during the use.

According to another alternative embodiment of the present invention there is provided a crystal growth system, wherein a separation S between the at least first and second thermal boundary members bounding the high-temperature zone is from 3 cm to 7 cm.

According to another alternative embodiment of the present invention there is provided a crystal growth system, wherein the wall of the crucible has a thickness T between 0.07 mm and 1.2 mm, According to another alternative embodiment of the present invention there is provided a crystal growth system, wherein the crucible has a volume between 20 cc and 2000 cc.

According to another alternative embodiment of the present invention there is provided a crystal growth system, comprising: a triple-zone temperature chamber co-axially containing a crucible assembly having at least three growth sections separated from the temperature chamber by at least two baffles and having sufficient separation therefrom to allow movement there-through during a use, at least one high temperature heating elements, and a means for controllably moving the crucible assembly within the triple-zone chamber during the use.

According to another alternative embodiment of the present invention there is provided a method of forming a crystalline based material, comprising the steps of: providing a precursor material, loading at least the precursor material into at least one crucible, placing the now-loaded crucible into a rigid ceramic member, filling a space formed between the crucible and the ceramic member with at least one powdered ceramic and forming a crucible assembly, providing a vertical furnace assembly containing at least a high-temperature zone, an upper low-temperature zone, and a lower low-temperature zone, wherein the low-temperature zones have a negative thermal gradient, inserting each the crucible assembly into the furnace assembly and positioning each the crucible assembly on a means for positioning the crucible relative to the high-temperature zone, providing a means for controlling of the crucible assembly, the furnace assembly, and the means for positioning, operating the furnace assembly and forming an as-grown crystalline material in the crucible at a rate from 0.2 to 2.5 mm/hr, and maintaining a temperature gradient at a growth interface in the crucible adjacent the high-temperature zone of from 10° C./cm to about 40° C./cm during the step of operating to form the crystalline material.

According to another alternative embodiment of the present invention there is provided a method of forming a crystalline based material, wherein: the precursor material includes a PMN-PT-based material.

According to another alternative embodiment of the present invention there is provided a method of forming a crystalline based material wherein the PMN-PT based material is, the selected composition having at least one of the following formulas:

$$Pb(Mg_{1/3}/Nb_{2/3})_{1-x}Ti_xO_3 \quad (I)$$

wherein x is defined as molar % 0.00 to 0.50 and,

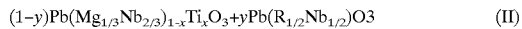

$$(1-y)Pb(Mg_{1/3}Nb_{2/3})_{1-x}Ti_xO_3 + yPb(R_{1/2}Nb_{1/2})O_3 \quad (II)$$

wherein x is defined as molar % 0.00 to 0.50, y is defined as molar % 0.00 to 0.25, and R is selected from Sc, Yb, Sn, In, Co, Lu and Tm.

According to another alternative embodiment of the present invention there is provided a method of forming a crystalline based material, wherein: the precursor material is the selected composition according to chemical formula I, and the step of loading includes the steps of selecting at least one seed crystal and placing the seed crystal at a bottom of the crucible prior to loading the precursor material.

According to another alternative embodiment of the present invention there is provided a method of forming a crystalline based material, wherein: the at least one crystal seed has an orientation including at least one of a <001>, <110>, <211> and a <111> orientation.

According to another alternative embodiment of the present invention there is provided a crystalline element, formed by a process described above, comprising: a ceramic material having a chemical formula according to at least one of formula I and II.

According to another alternative embodiment of the present invention there is provided a crystalline element, wherein the crystalline element has a chemical formula according to formula II and an effective Tc ° C. of greater than 1686° C.

According to another alternative embodiment of the present invention there is provided a crystalline element, formed by a previously described method, wherein: one of a longitudinal and a thickness direction of the crystalline element is at least one of a <001>, <110>, <211>, and a <111> orientation and the crystalline element has an effective coupling constant of at least 0.90.

According to another alternative embodiment of the present invention there is provided a method of forming a crystalline piezoelectric based material, wherein the step of operating further comprises the steps of: ramping a furnace temperature, up to less than 1480° C., at a rate of 100° C./hr, holding the furnace temperature at 1430~1480° C. for 6 to 12 hrs, while operably adjusting positions of each crucible assembly and regulating the furnace temperature to confirm the following conditions for each respective crucible during the hold time:

(a) maximum temperature in a melting zone of less than about 1360° C.,
(b) vertical temperature gradient at a middle of a crystal seed of greater than 25° C./cm, and
(c) stable crucible temperature within +/−2° C./hr change, and soaking each crucible for a minimum 2 hours after achieving the above-defined stable crucible temperature, to begin a crystal growth period.

According to another alternative embodiment of the present invention there is provided a PMN-PT based material, comprising: a single crystal, and the single crystal having a formula:

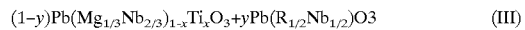

$(1-y)Pb(Mg_{1/3}Nb_{2/3})_{1-x}Ti_xO_3 + yPb(R_{1/2}Nb_{1/2})O_3$ (III)

wherein x is defined as molar % 0.00 to 0.50, y is defined as molar % 0.00 to 0.25, and R is selected from Sc, Yb, Sn, In, Co, Lu, and Tm.

According to another alternative embodiment of the present invention there is provided a PMN-PT based material wherein: the single crystal element has at least one of a <001>, <110>, <211> and <111> orientation.

According to another alternative embodiment of the present invention there is provided a PMN-PT based material, wherein and the single crystal element has a $T_c$ at least from 5 to 10% higher than known PMN-PT crystalline materials.

The above, and other objects, features and advantages of the present invention will become apparent from the following description read in conduction with the accompanying drawings, in which like reference numerals designate the same elements.

DETAILED DESCRIPTION OF THE PREFERRED EMBODIMENTS

In coping with the problems noted above, the present invention provides a system for cost effectively manufacturing PMN-PT based crystalline materials having greatly reduced compositional variability. The present invention provides a hybrid Stockbarger zone-leveling growth system with multi-crucible capacity and compositions providing important piezoelectric characterizes.

Figure 1A:
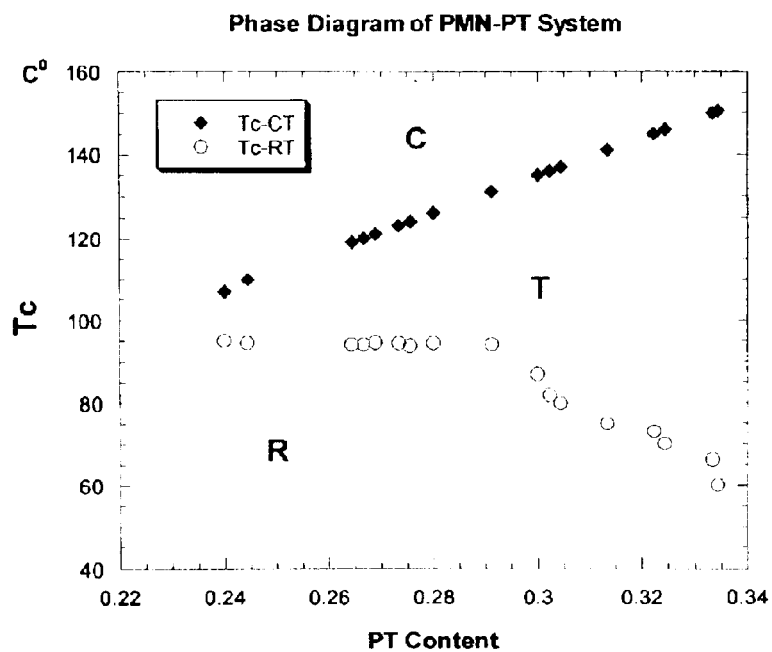
FIG. 1(A) is a partial phase diagram of a conventional PMN-PT system.
Figure 1B:
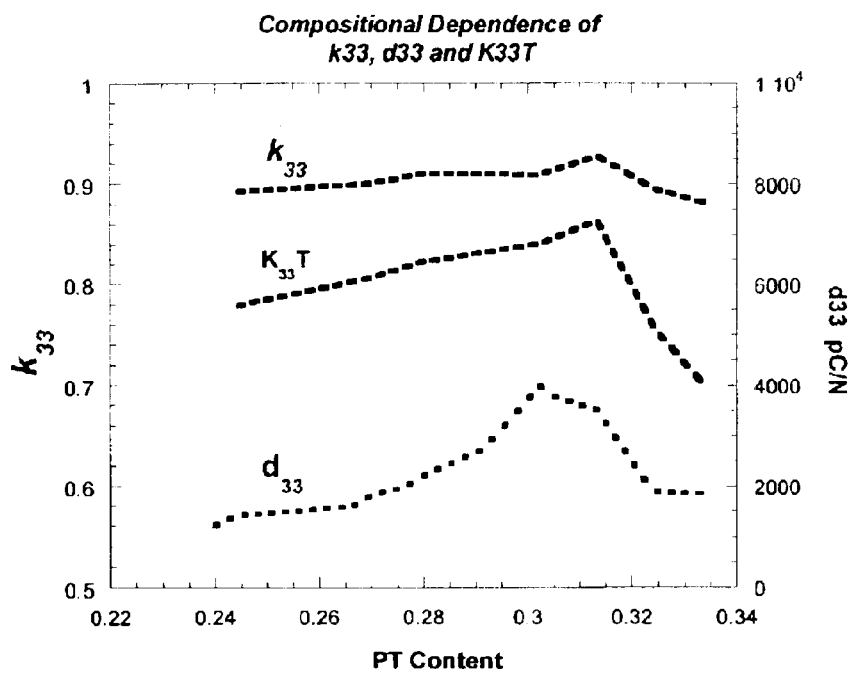
FIG. 1(B) is a diagram showing the compositional dependence on the piezoelectric properties ($k_{33}$, $d_{33}$, and $K_{33}T$) of a single crystal PMN-PT made by a conventional method.
Figure 2:
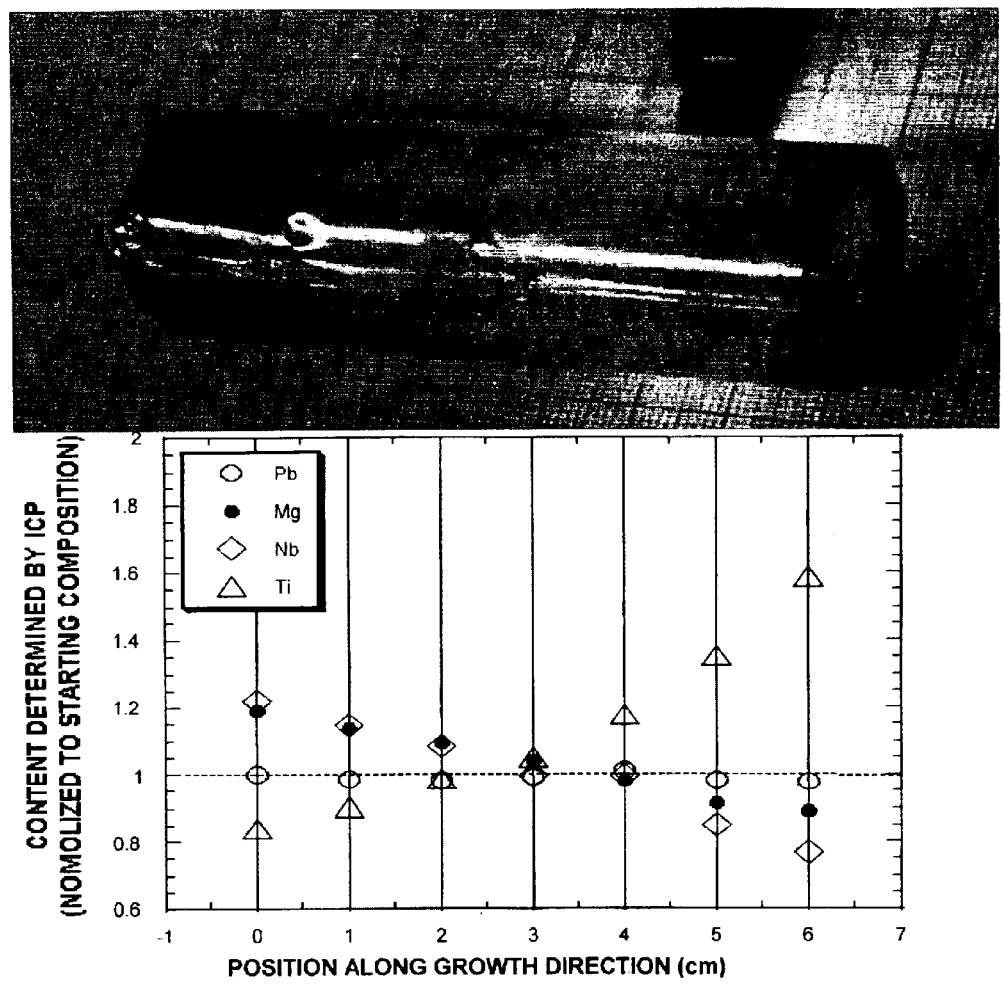
FIG. 2 is a diagram of the compositional segregation effect, measured by ICP, on a PMN-32% PT single crystal boule grown by a conventional Bridgman growth method and a photograph of the boule examined.
Figure 3A:
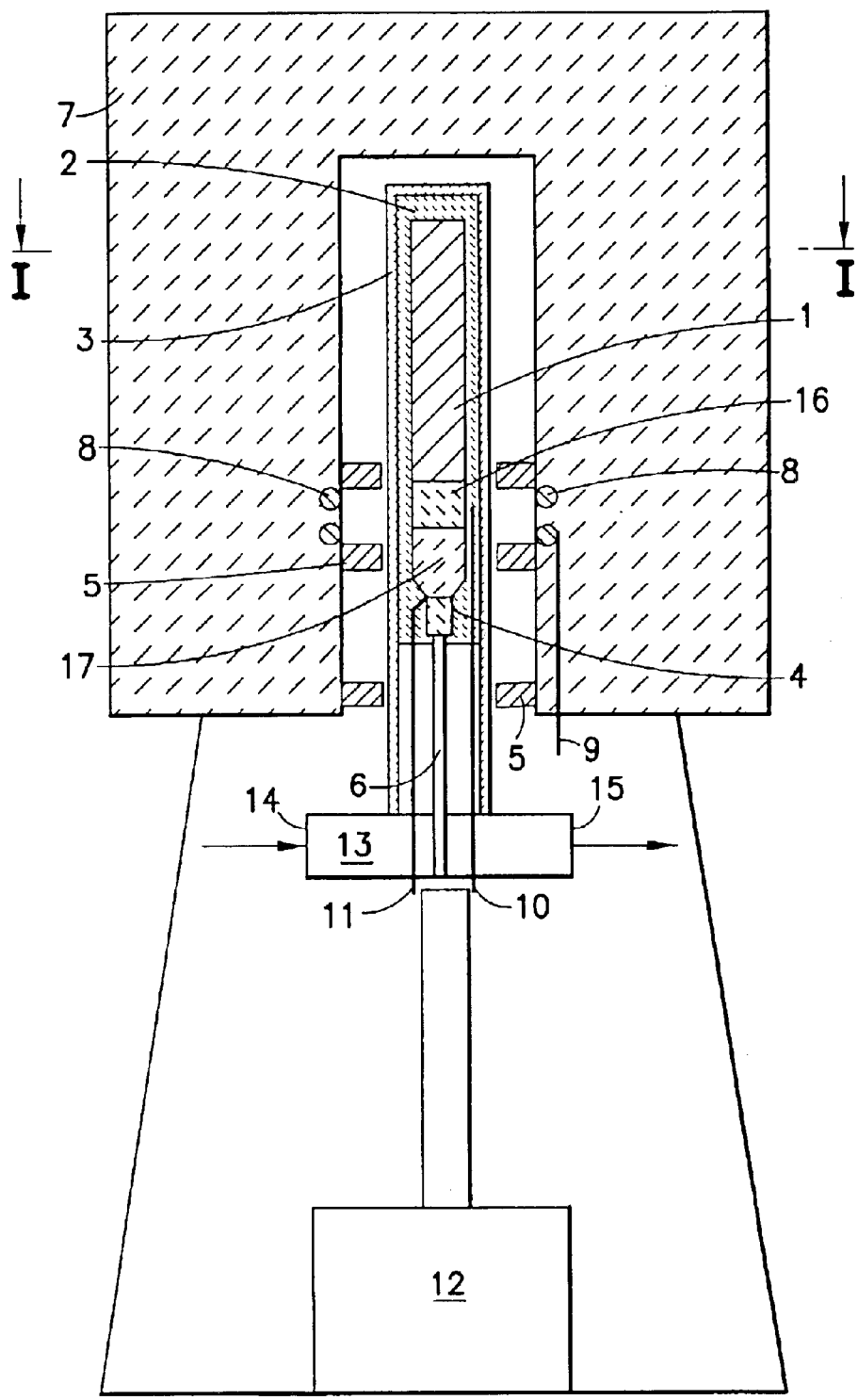
FIG. 3(A) is a front view drawing of a hybrid Stockbarger zone-leveling melting crystal growth furnace according to the present invention.
Figure 3B:
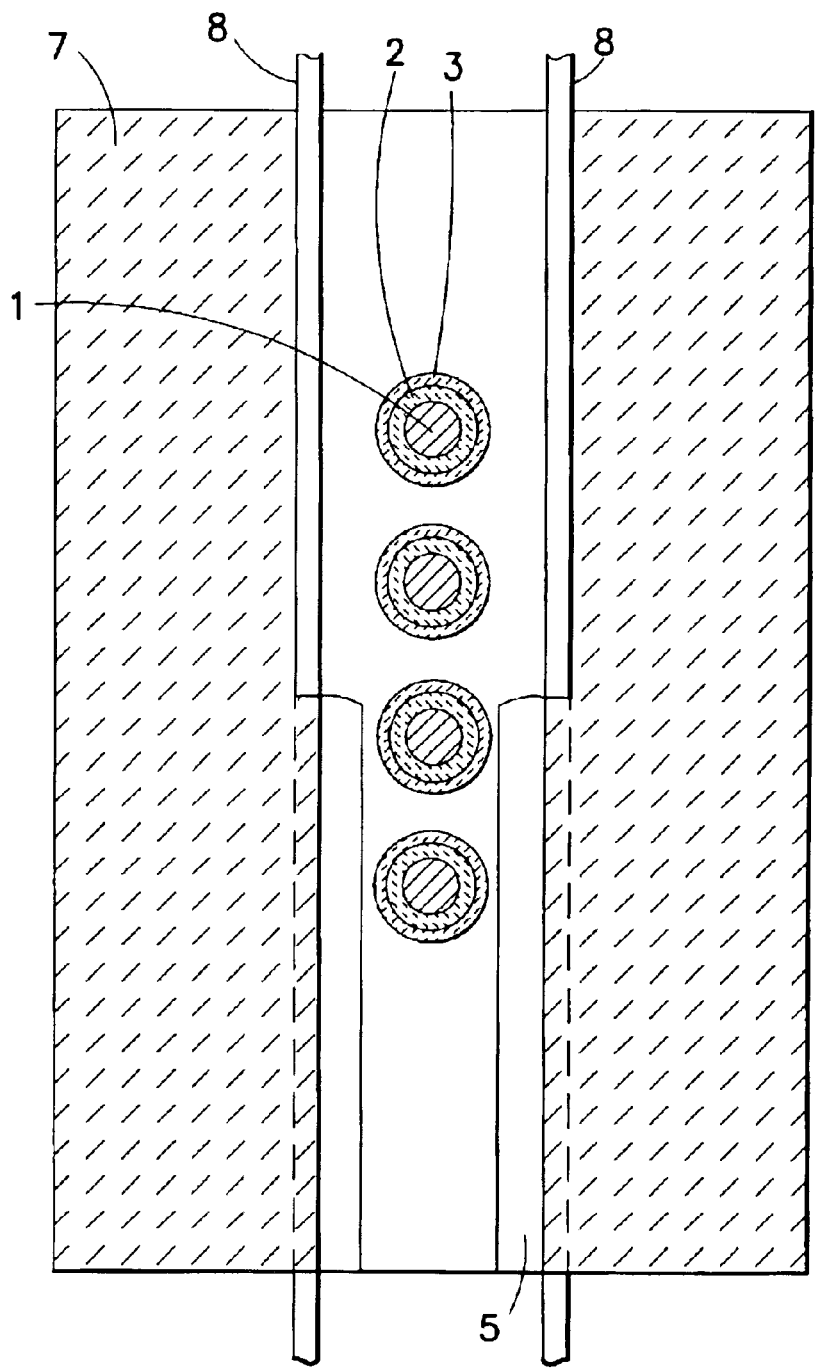
FIG. 3(B) is a partially cut-away horizontal cross-section along line I—I of FIG. 3(A).

Referring now to FIGS. 3(A) and 3(B), a hybrid Stockbarger zone-leveling crystal growth system includes a support structure for supporting a levitation system 12, a cooling system 13, and a vertical insulating chamber 7. Insulating chamber 7 has a vertical central open passage and functions as a vertical furnace, as will be described. Levitation system 12 operably supports (levitates) individual crucible assemblies (shown but not numbered) within a thermal chamber formed within insulating chamber 7, as will be described. Levitation system 12 operates as a means for positioning, as will be described. The thermal chamber is horizontally divided into at least three temperature zones.

Each crucible assembly is co-axially and vertically aligned within insulating chamber 7. Multiple crucible assemblies are operable within the thermal chamber in a number of arrangements, each providing the respective crucible with an effective 3-zone temperature chamber, as will be described. The embodiment shown discloses a single line of 6 crucible assemblies, but a single line of many more crucibles is possible, as are double, triple, or multiple lines of multiple crucibles in various configurations. In sum, the present invention allows a great many crucible assemblies or crucibles to operate and achieve superior compositional homogeneity. The ability to employ multiple assemblies greatly increases production capacity.

Within each assembly, the crucibles are preferably Pt or a Pt-alloy, but may be any other material or composition suitable for the present compositions and effective within the bounds of the present invention. The crucibles have a thin wall thickness of roughly 0.08mm~1.0 mm, and depending on a desired crucible volume and the composition of interest, a diameter of roughly 12.5~50mm, a length of roughly 100~500 mm, and a volume of roughly 100~2000 cc. Within the ranges provided, the dimensions of the Pt crucibles are adjustable according to an operator's desired useful volume, crystallization speed, and other process control parameters.

Within each crucible, during formation sections of the present invention include an as-grown crystal section 17, a melting section 16, and a batch material section 1, each in respective coaxial alignment. Batch material section 1 contains the selected preloaded and prepared batch materials. A ceramic tube 3, preferably formed from alumina ($Al_2O_3$), surrounds a ceramic powder 2. Ceramic tube 3 serves as a thermal baffler tube between the inner crucible and powder and the outer atmosphere. Ceramic powder 2 fills the volume between the Pt crucible and alumina tube 3. Ceramic powder 2 may be alumina, zirconia powder, or a combination thereof or any other suitable material.

The three-zone vertical temperature chamber of the present invention has sufficient open area to allow each crucible assembly to be vertically adjusted (positioned) during crystal growth by levitation system 12 (means for positioning) while maintaining a sharp thermal gradient. In the embodiment shown, the crucible assemblies have circular outer surfaces, but may alternatively have other shapes, which retain the ability to move within the vertical furnace. In each embodiment, the crucible assemblies each have a common outer bounding surface of a predetermined shape.

Heat insulation buffers 5, serve as thermal boundaries and thermally separate the vertical furnace into three distinct thermal zones. In a first embodiment, at least two sets of buffers 5 separate the vertical furnace into three distinct thermal zones. These first two sets of buffers 5 are positioned closely on either side of a set of heating elements 8 which operate as thermal in-put members or means for inputting thermal energy into the present system. In a second embodiment (shown), heat insulation buffers 5 are positioned in three sets, along the inner surface of insulating chamber 7. In this embodiment, two sets of buffers 5 bound heating elements 8 and a third buffer is adjacent a bottom opening of the vertical furnace. In either embodiment, buffers 5 are closely adjacent the outer bounding surfaces respective crucible assemblies, within about 5 mm, and are consequently effective to divide the vertical furnace in to three-temperature zones during use while allowing for easy vertical movement of the crucible assembly during assembly and crystal growth.

The upper two sets of buffers 5 are positioned closely together on either side of heating elements 8 and form a very narrow high temperature zone. The upper two sets of buffers 5, adjacent the outer bounding surface of each crucible assembly, function to narrowly focus thermal energy on melting zone 16 and hence the crystal growth interface, thereby providing rapid thermal homogeneity to complete melting without segregation. In alternative embodiments, buffers 5 are positioned preferably less than about 5 mm, and more preferably less than about 3 mm, from the outer bounding surface of each crucible assembly.

During operation, the very narrow high-temperature zone enables temperatures from about 1310° C. to about 1375° C. and a very narrow temperature gradient control adjacent the growth interface of between about 5 to about 40° C./cm.

Above the first two sets of buffers 5 is an upper low-temperature zone having a negative thermal gradient as a function of distance from the high-temperature zone. Below the first two sets of buffers 5 is a lower low-temperature zone, also having a negative thermal gradient. Each low-temperature zone has a negative thermal gradient since each has a sharply decreasing temperature/distance curve relative to the high-temperature zone.

The present three-zone vertical furnace is adaptable to applications requiring different temperatures, but the operational principals for crystal growth will be the same, i.e. tight focus of thermal energy with a zone above and a zone below having a negative thermal gradient below the melt temperature to respectively prepare the batch material section 1 for melting, and cool the as formed melt into a homogenous solid.

In the second embodiment (as shown in FIGS. 3(A) and 3(B)), the lower set of buffers 5 (the third set shown) is adjacent a bottom edge of insulating chamber 7, and provide thermal gradient control adjacent each as-grown crystal 17 during downward movement of the crucible, and define the bottom of the lower low-temperature zone. In the second embodiment, the lower set of buffers 5 is from about 5 cm to about 10 cm or more from the middle set of buffers but may be positioned a distance specific to the thermal cooling needs of an as-grown crystal 17 compound, and the geometric vertical form of insulating chamber 7. In the second embodiment the lower set of buffers 5 defines the lower low-temperature zone, and allows for easy control of crystallization, which impacts the resultant piezoelectric and physical properties of the grown crystal.

In both the first and second embodiments of the present invention, buffers 5 have an outer planar surface proximate the outer acute surface of each crucible assembly. However, in each of the embodiments disclosed, the commonality is that buffers 5 serve as thermal boundaries or thermal resistors having inner surfaces proximate the outer surfaces of the crucible assemblies. These inner and outer and outer surfaces may be curved, planar, or a combination of both so long as the distance between them and the crucible assembly is sufficiently small to maintain a desirable thermal gradient while operably growing the crystals.

In a third embodiment of the present invention (not shown), buffers 5 are formed with a series of outer concave surfaces closely matching the outer acute surface of each crucible assembly. In this embodiment, buffers 5 substantially encircle each crucible assembly to retain thermal energy in the very narrow high-temperature zone.

In a fourth embodiment of the present invention (not shown), buffers 5 are each formed in a single thermally restrictive plate spanning insulating chamber 7. Holes are formed in the plates allowing vertical movement of each crucible assembly relative to heating elements 8. In this embodiment, each plate-like buffer 5 surrounds each crucible assembly and provides a very narrow high-temperature gradient.

In any embodiment, the distances between sets of buffers 5, define the at-least-three temperature zones, and are positionally adjustable depending upon multiple parameters including; crucible assembly size and shape, desired thermal gradient, relative position between each crucible assembly and the walls of insulating chamber 7, and more. The position of buffers 5 is necessitated by the need to achieve the below-described thermal gradient factors, and the design and positioning of buffers 5 is adapted accordingly.

The present invention is in-part characterized by the above-described three-zones, which enable the system to have both narrow zone melting with a small high-temperature gradient and Stockbarger-type functions. The additional set of buffers 5 added to the walls of insulating chamber 7 in the second embodiment provides even more control over the cooling and solidification process of as-grown crystal 17. Additional embodiments are also envisioned wherein multiple sets of three-thermal zones are vertically extended serving similarly stacked crucible assemblies.

Heating elements 8, are thermal input members (thermal members or thermal in-put means) and may be selected from commonly known heating elements of silicon carbide, molybdenum disilicide ($MoSi_2$) or platinum and platinum-rhodium (Pt/Rh).

A cooling mechanism 6 extends from cooling system 13 to each crucible assembly and each crucible adjacent seed crystal 4, as shown. Under certain material formula, seed crystal 4 is not used, and the as grown boule is not a single crystal.

A thermocouple 10, adjacent melting zone 16, extends to a temperature and interface controller system (not shown but described). A thermocouple 11, adjacent as-grown crystal 17, similarly extends to the temperature and interface controller system. A thermocouple 9 also extends from heating elements 8 to the temperature and interface controller system and allows furnace temperature control. Thermocouples 9, 10, and 11 may be Type S or R thermocouples. The present embodiment employs type-R thermocouples.

The completed crucible assemblies include the crucible, thermocouples 10, 11, ceramic tube member 3 with ceramic powder 2, and cooling mechanism 6. Levitation system 12 supports and operably controls the downward movement of the crucible assembly, as will be described. Levitation system 12 is operably controllable by the temperature and interface controller system. Levitation system 12 allows easy and individual manual positioning manipulation of each crucible assembly as required. Cooling mechanism 6 joins the Pt crucible and cooling system 13, as shown. The position of each crucible assembly is adjusted to remove any temperature inhomogeneity and retain optimal homogenous melting and solidification conditions for melting.

Cooling system 13 includes an inlet 14, an outlet 15, and cooling mechanism 6. Cooling system 13 operably connects to the temperature and interface controller system (not shown). Cooling mechanism 6 may be ceramic rods of ZrO2:Y2O3 or Al2O3 or noble metals including Pt, or alloys of Pt/Rh, etc. Cooling system 13 is adjustable to maintain the desired temperature for seed crystal 4 during the crystal growth process.

Levitation system 12 includes a vertical motion assembly containing a worm gear box, a worm shaft driven by a stepping motor (Hurst 3004) and a Hurst EPC-013 digital stepping motor controller (all not shown). The digitally controlled stepping motor (not shown) drives levitation system 12. Levitation system 12 can move the crucible assemblies relative to the three-zone temperature chamber at rates ranged from 0.1 mm/hr to 100 mm/hr, and most preferably from about 0.4 to about 2.5 mm/hr for preferred crystal growth.

During operation and crystal growth, the crucible assemblies are drawn downward by levitation system 12 at a controlled rate allowing the cooler solid (un-melted) batch materials above the melting zone to be rapidly and hence homogenously melted as they enter the melting zone and just as quickly re-solidify into as-grown crystal 17. In this manner, directional crystal growth from seed crystals is automatically performed and homogeneity is greatly improved.

The temperature and interface controller system (not shown) includes a EUROTHERM 818P programmable temperature controller with type R thermal couple connections linked with a EUROTHERM 830 SCR power controller which maintains the furnace temperature around 1450 C+0.1° C. A Pentium III PC acts as the interface controller and temperature controller (not shown), power controller (not shown), thermocouples 9, 10, and 11, and the digital stepping motor controller (not shown) and drives each motor to achieve the programmed growth rate. A HP-34970A Data Acquisition Unit collects all temperature and position information and interfaces with the Pentium III PC for displaying, tracking, and recording.

In summary, the above three-zone hybrid vertical furnace creates an upper-low temperature zone, above the top pair of buffers 5; a very narrow high-temperature zone between the first and second pair of buffers 5; and a lower low-temperature zone below the second pair of buffers 5. Alternative embodiments provide a third set of buffers 5 at the bottom of the vertical furnace for additional thermal and compositional control within the lower low-temperature zone.

During operation, the very narrow high-temperature zone enables a thermal gradient to exist adjacent the melt zone of from about 10 to about 40° C./cm. The very narrow high-temperature zone has a total length of from about 3.0 cm to about 6.0 cm, and more preferably from about 3.0 to about 4.5 cm. During operation, a maximum temperature measured on the crucible wall is less than about 1375° C., and preferably about 1360° C., with a minimum temperature similarly measured at above about 1310° C. for the compositions shown. It should be understood that the present invention envisions different temperatures and gradients of use necessitated by different compositional systems but relying on the principles embodied and described herein to allow easy production of crystalline based grown materials (either single crystal or polycrystalline).

Figure 4:
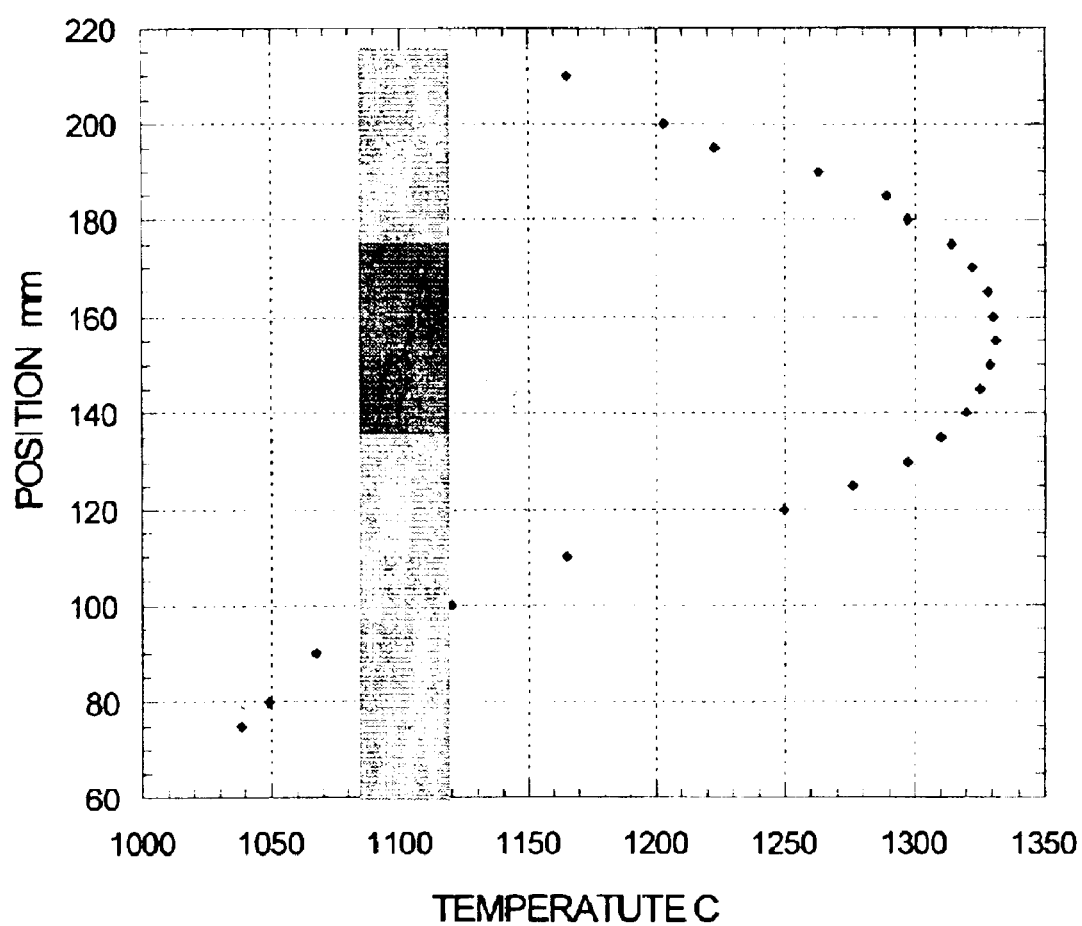
FIG. 4 is a vertically measured temperature distribution profile in the three-zone crystal growth furnace according to the present invention.

Referring now to FIG. 4, a representative vertical temperature profile for the present invention shows the sharp and narrow thermal gradient in the high-temperature zone enabled by the present system. The present design also enables the upper low-temperature zone, adjacent the bulk materials, to have a negative thermal gradient from about 40 to 100° C./cm plus, a length of about 4 to more than 8 cm, and to maintain temperatures below about 1310° C. vertically along the crucible assembly. The lower low-temperature zone also enables a similar negative thermal gradient and allows homogenous cooling of the as-formed crystalline boule with a similar negative thermal gradient. The upper and lower low-temperature zones have negative thermal gradients, meaning that in each of these zones the temperature substantially reduces as a function of the distance from the center of the very narrow high-temperature zone. As a consequence of the present design, a very sharp vertical temperature profile exists while allowing easy movement of each crucible assembly. The present hybrid zone melting system carefully directs crystallization.

An embodiment of a Hybrid Stockbarger Zone-Leveling Melting Method employing the above-described furnace is now described Batching and Precursor Preparation The method begins with creating the above-described vertical furnace according to any one of the embodiments, and batching and forming the precursor preparation by selecting powders of MgO, $Nb_2O_5$, $TiO_2$ and $Pb_3O_4$ with purities greater than 99.9% as starting raw chemicals. These polycrystalline precursors may be the PMN-PT ceramic with a preferred composition, (1−x)*PMN-x*PT, with x from 0 to 50% made by a conventional ceramic process. The compound selected may be alternatively expressed as follows:

$$Pb(Mg_{1/3}Nb_{2/3})_{1-x}Ti_xO_3 \qquad (IV)$$

wherein x is defined as molar % 0.00 to 0.50

Alternatively, the above Formula I may be doped with dopants such as Sc, Yb, In, Sb, and Tm of a combined total from 0 to about 15% mole. The dopants actually substitute the B-site elements in the $ABO_3$ Perovskite structure. If the doped $Pb(Mg_{1/3}Nb_{2/3})_{1-x}Ti_xO_3$ is simplified to be described as $Pb(B_1,B_2)O_3$, and $B_1$ is Mg, Nb, and Ti, then $B_2$ is one of the dopants: Sc, Yb, Sb, In and Tm. The doped compound may be alternatively expressed as follows.

$$(1-y)Pb(Mg_{1/3}Nb_{2/3})_{1-x}Ti_xO_3 + yPb(R_{1/2}Nb_{1/2})O3 \qquad (V)$$

wherein x is defined as molar % 0.00 to 0.50, y is defined as molar % 0.00 to 0.25, and R is selected from Sc, Yb, Sn, In, Co, Lu and Tm, and $Pb(R_{1/2}Nb_{1/2})O_3$ is an isomorphous Perovskite as the PMN-PT.

It should be noted that all the dopants claimed are tri-valences whereas Mg is bi-valent, so the R/Nb ratio is 1/1, whereas Mg/Nb=1/2, which necessitates the chemical Formula II. This maintains the electrical balance for the resulting lattice. All the doped crystals have similar piezoelectric properties, but have resultant $T_c$'s roughly 5–10% higher than pure PMN-PT crystals.

Using any of the combinations above, the powders are mixed and loaded into a crucible. The next step is sintering the palletized powders in a covered platinum container at 1275° C. for 2~6 hrs in an air atmosphere. These precursors may alternatively be prepared by melting the whole powders in a closed platinum cylindrical container, i.e., holding the platinum container in 1335° C. for 1 hour, then quenching to room temperature.

Crystal Growth Process or the Thermal Process of the Growth Furnace (1) Crucible loading: Loading a ceramic precursor, constituting a material selected from chemical formula I or II defined above as being an operably preferred composition and a crystal seed where desired, into a desired number of platinum (or alloy based) crucibles, and sealing each respective crucible. The crystal seed may be selected from a desired orientation including <001>, <110>, <211> and <111> depending on a desired final cutting direction of the as-grown PMN-PT (or doped) crystal boules. Under a doped-compound situation, a crystal seed is not used, but the resultant crystal boules are multiple not single crystals.

(2) Inserting the now-loaded platinum crucibles into alumina tube 3. To protect each platinum crucible from deformation at high temperature, ceramic powders are filled in between ceramic tube 3 and the crucible, forming ceramic powder 2.

(3) Securing thermocouples 10 and 11 in each respective crucible assembly.

(4) Joining cooling mechanism 6 with each respective assembly.

(5) Positioning each assembly respectively in insulating chamber 7 on supporting levitation system 12 and operably joining each assembly with cooling system 13.

(6) Controllably connecting each assembly to the temperature and interface control system.

(7) Ramping furnace temperature, via heating elements 8, up to around 1430~1480° C. at a rate of 100° C./hr (measured from thermocouple 8).

(8) Holding furnace temperature at 1430~1480° C. (holding temperature) for about 6 to 12 hrs, while operably adjusting positions of each crucible assembly and/or regulating the furnace temperature to confirm the following conditions for each respective crucible during the hold time:

(a) maximum temperature in the melting zone 16 of less than 1375° C., and preferably less than about 1360° C. (measured on the crucible wall by thermocouple 10)

(b) vertical temperature gradient at the middle of the crystal seed greater than about 25° C./cm (measured on the crucible wall by thermocouples 10 and 11, wherein the gradient is the difference between thermocouple 10 and 11 over the distance there-between)

(c) maintaining a stable crucible temperature within +/−2° C./hr change (d) maintaining a negative thermal gradient, both above and below the melting zone of greater than about 25° C./cm (9) Soaking each crucible for a minimum 2 hours after achieving the above-defined stable crucible temperature, to begin a crystal growth period.

(10) Beginning the crystal growth period by moving each crucible assembly downward, at rate of from about 0.2 to about 2.5 mm/hr, toward levitation system 12 (through the very narrow high-temperature zone into the lower low-temperature zone to crystallize the melt). During this growth period, the furnace temperature is kept constant. The crystal growth period is the period from the end of the Soak throughout the time when the crucible assembly moves downward to a preferred completed length.

(11) Terminating downward movement of each crucible assembly at a preferred length of crystal growth by cooling the furnace from the holding temperature of 1430~1480° C. (read from thermocouple 8) to room temperature at a rate of from 30~60° C./hr.)

(12) Removing as-grown crystal(s) from the crucible assemblies by peeling the soft platinum foil off the crucible wall and removing any seed.

The testing and characterization of the piezoelectric single crystals was characterized in the follow manner, using in common the following equipment. Dielectric constant and dispassion and resonance frequency were measured using a HP-4192A Impedance Analyzer. Piezoelectric coefficient ($d_{33}$) was measured on a Berlincout type $d_{33}$ meter with the full scale of 8000 pC/N. Electromechanical coupling factor ($k_{33}$) was calculated with IEEE 176-1987 standard. Curie temperatures ($T_c$'s) were determined by measurements of temperature dependence of dielectric constant and dispassion at different frequencies. Macro defects and ferroelectric domain structures were observed using a stereomicroscope under strong light beam or crossed polarized light. The chemical compositions of as-grown crystals were analyzed by ICP atomic absorption spectroscopy. (ICP: Induction Coupled Plasma spectroscopy)

Using the above-described present inventions, various experiments were conducted. Selected experimental results are presented below for review.

Experiment 1

Six crucibles, diameter 35 mm×150 mm long, were loaded with a precursor of composition 70% PMN-30% PT., and <011> seeds, diameter 12.5 mm×25 mm long, were located at the bottom of each platinum crucible.

Maximum temperature of the furnace was 1445° C. The vertical temperature gradient near the seeds was 30~35° C./cm. The temperature gradient was calculated by Delta thermocouple 11 over Delta moving downward distance ΔT11/ΔL when the ΔL reached 10 mm. However, before starting the growth period, the temperature gradient can only could be estimated by (T10–T11)/distance between T11–T10. (The temperature gradient calculations were similar for each experiment)

After soaking 9 hrs, crystal growth was initiated by moving the crucibles downward at a rate of 0.6 mm/hr. After moving each crucible downward a total of 100 mm, crystal growth was terminated. Slow cooling to room temperature was conducted at a rate of 60° C./hr. Six crystal boules were obtained, each having the dimensions of: diameter about 35 mm×100~120 mm.

Figure 5:
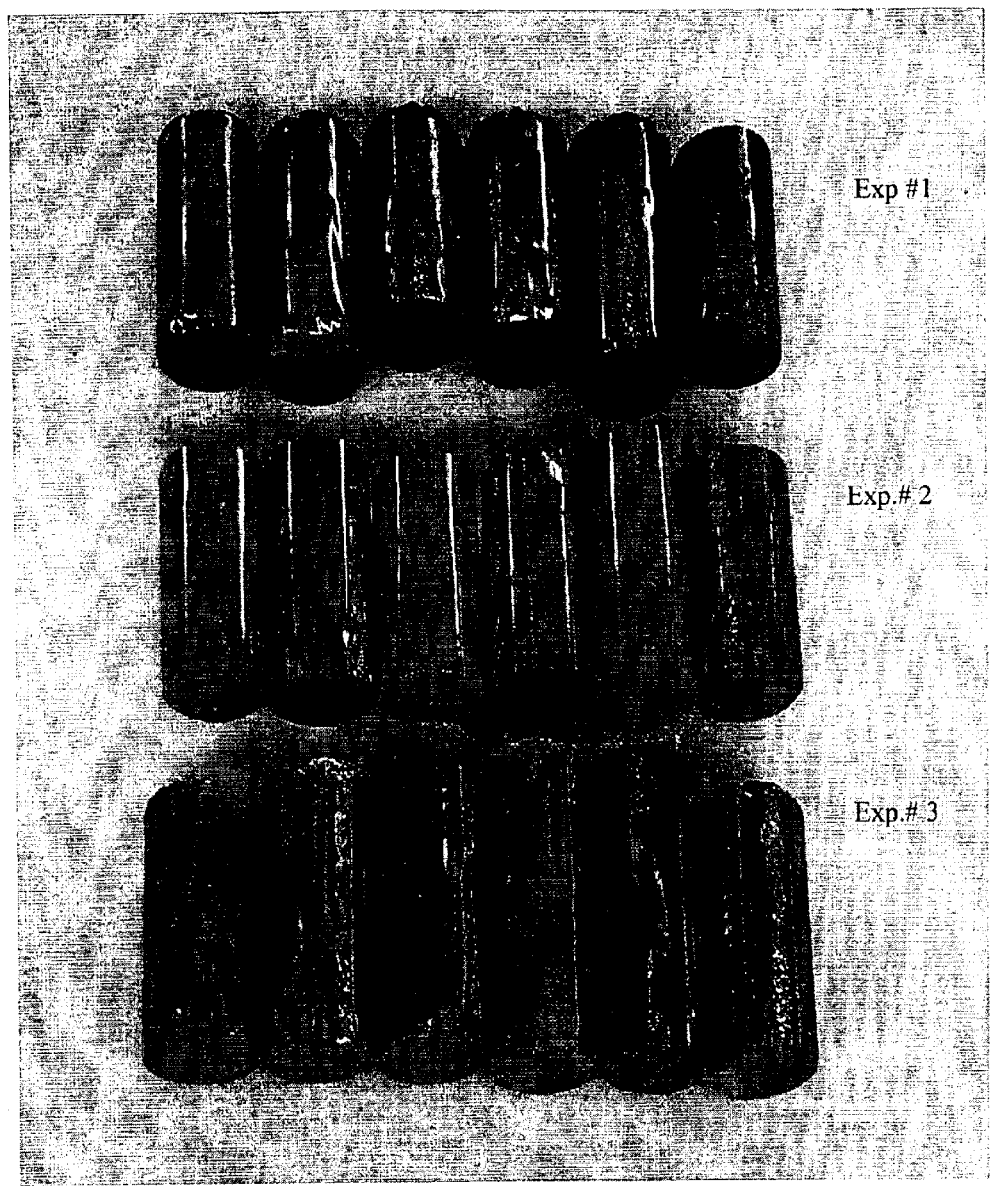
FIG. 5 is a photograph showing the 6-boule sets of PMN-PT single crystals grown from the 6-crucible hybrid Stockbarger zone-leveling method, respectively for Experiments 1, 2 and 3, according to an embodiment of the present invention.

Referring now to FIG. 5, the top row of boules shows the six PMN-PT crystal boules of Experiment 1. It should be understood that all seeds were cut off the PMN-PT single crystal boules shown.

Six wafers were cut off from the middle segments of each of the six crystal boules. A few of specimens of 5 mm×5 mm×0.5 mm with {100} orientation on each surface were made and electroded on the 5 mm×5 mm surfaces. Test results are as follows.

TABLE I

| Parameters | Experiment 1 |
|---|---|
| $d_{33}$ | ~1950 pC/N |
| Dielectric constant $K_3^T$ | ~5040 |
| tgδ (1 kH, 20° C.) | ~0.27% |
| Crystal Structure (X-ray diffraction) | Rhombohedral |

Experiment 2

Six crucibles, diameter 35 mm×150 mm long, were loaded with a precursor of composition 67% PMN-33% PT., <111> seeds, diameter 33.5 mm×25 mm long, located at the bottom of each platinum crucible.

Maximum temperature of the furnace was 1452° C. The vertical temperature gradient near the seeds was 27~35° C./cm. After soaking 8 hrs, growth was started by moving the crucibles downward at a rate of 0.8 mm/hr. After moving each crucible downward a total of 100 mm, crystal growth was terminated. Slow cooling to room temperature was conducted at a rate of 45 C/hr. Six crystal boules were obtained, each having the dimensions of: diameter 35 mm×100~120 mm.

The middle row of boules in FIG. 5 shows the six PMN-PT crystal boules created. Again, all seeds were cut off.

Six wafers were cut off from the middle segments of each of the six crystal boules. A few of specimens of 5 mm×5 mm×0.5 mm with {001 } orientation on each surface were made and electroded on the 5 mm×5 mm surfaces. Test results are as follows.

TABLE II

| Parameters | Experiment 2 |
|---|---|
| $d_{33}$ | ~2800 pC/N |
| Dielectric constant $K_3^T$ | ~6200 |
| tgδ (1 kH, 20° C.) | ~0.42% |
| Crystal Structure (X-ray diffraction) | Rhombohedral |

Experiment 3

Six crucibles, diameter 35 mm×150 mm long, were loaded with a precursor of composition 75% PMN-35% PT., <001> seeds, diameter 31 mm×25 mm long, were located at the bottom of each platinum crucible.

Maximum temperature of the furnace was 1445° C. The vertical temperature gradient near the seeds was about 30~35° C./cm. After soaking 6 hrs, growth was started by moving the crucibles downward at a rate of 0.9 mm/hr. After moving the crucibles downward a total of 100 mm, crystal growth was terminated. Slow cooling to room temperature was conducted at a rate of 45 C/hr. Six crystal boules were obtained, each having the dimensions of: diameter 35 mm×100~120 mm.

The bottom row of boules in FIG. 5 shows the six PMN-PT crystal boules created. Again, all seeds were cut off.

Six wafers were cut off from the middle segments of the six crystal boules. A few of specimens of 5 mm×5 mm×0.5 mm with {001} orientation on each surface were made and electroded on the 5 mm×5 mm surfaces. Test results are as follows:

TABLE III

| Parameters | Experiment 3 |
|---|---|
| $d_{33}$ | ~1950 pC/N |
| Dielectric constant $K_3^T$ | ~5040 |
| tgδ (1 kH, 20° C.) | ~0.30% |
| Crystal Structure (X-ray diffraction) | Rhombohedral |

In this experiment, some unexpected nuclei occurred between the platinum crucible wall and seeds at the very beginning of the growth. The <001> seeding was partially interfered by insertions of <111> or <110> crystal clusters.

Experiment 4

Five crucibles, diameter 40 mm×180 mm long, were loaded with a precursor composition of 68% PMN-32% PT., <211> seeds, diameter 35 mm×35 mm long, were located at the bottom of each platinum crucible.

Maximum temperature of the furnace was 1485° C. The vertical temperature gradient near the seeds was 25~28° C./cm. After soaking 6 hrs, growth was started by moving the crucibles downward at rate of 0.8 mm/hr. After moving the crucible down a total of 140 mm, crystal growth was terminated. Slow cooling to room temperature at a rate of 45 C/hr. Five crystal boules were obtained, each having a dimension of: diameter 40 mm×125~145 mm.

Figure 6:
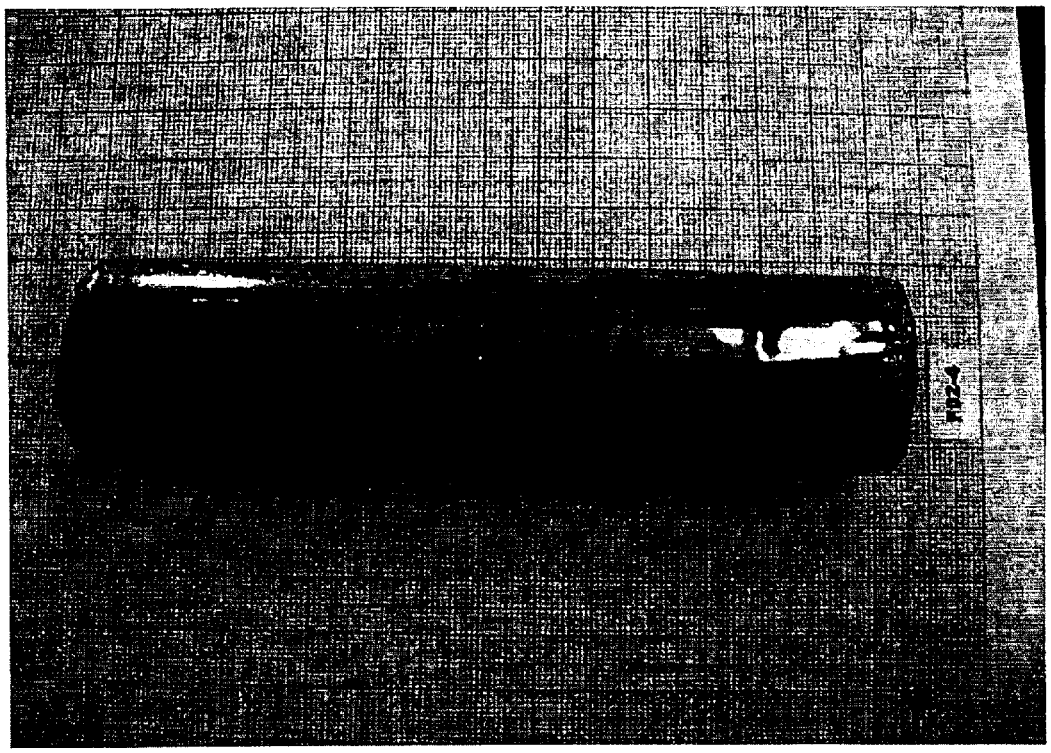
FIG. 6 is a photograph of a PMN-PT single crystal grown from a 5-crucible growth furnace according to the present invention.

Referring now to FIG. 6, a single crystal the PMN-PT boule No. 4 (1.5 kg) of the 5 crystal boules is shown having a diameter 40 mm×140 mm long.

One wafer was cut from the middle of the crystal boule. A few of specimens of 5 mm×5 mm×0.5 mm with {001} orientation on each surface were made and electroded on the 5 mm×5 mm surfaces. Crystal specimens were poled under 3.5 kV/cm at 20° C. Test results are as follows:

TABLE IV

| Parameters | Experiment 4 |
|---|---|
| $d_{33}$ | ~2,100–2,350 pC/N |
| Dielectric constant $K_3^T$ | ~5600 |
| tgδ (1 kH, 20° C.) | ~0.30% |
| Crystal Structure (X-ray diffraction) | Rhombohedral |

Figure 7:
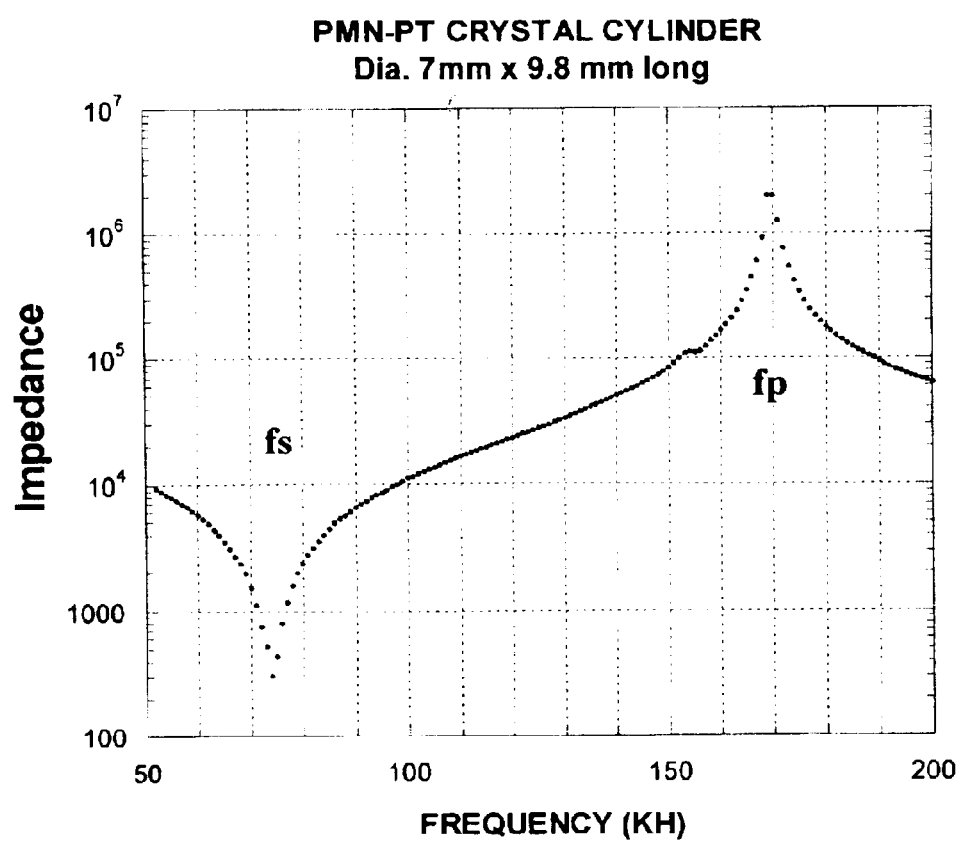
FIG. 7 is graph of the results of a resonance test on a PMN-PT single crystal cylinder according to an embodiment of the present invention, poling along <001>, parallel to cylinder axis.

Referring now to FIG. 7, for Experiment 4, electromechanical coupling $k_{33}$~93% was calculated from the resonance test on a long cylinder specimen of diameter 7 mm×9.8 mm long, poling along <001> parallel to cylinder axis. The $k_{33}$ value was calculated using the formula $k_{33}^2 = (\pi 8 \text{ fs}/2\text{fp})*\tan(\pi(\text{fp}-\text{fs})/\text{fp})$, based on the IEEE std. 176-1987.

Experiment 5

Six conical crucibles, diameter 12.5 mm×125 mm long, were loaded with a precursor composition of 69% PMN-31% PT and dopants as listed in Table V, without seeds. The dopants were oxide mixtures formed without sintering process.

Maximum temperature of the furnace was 1485° C. The vertical temperature gradient near the bottom of the crucibles was 35~50° C./cm. After soaking 6 hrs, growth was started by moving the crucibles downward at rate of 0.8 mm/hr. After moving the crucible down a total of 60 mm, crystal growth was terminated. Slow cooling to room temperature at a rate of 45 C/hr was conducted. Five crystal boules were obtained, each having a dimension of: diameter 12.5 mm×50~60 mm. The crystal boules were not single crystals (no seeds were used), however they were clusters of 2~3 single crystals combined, and each single crystal size was large enough for preparation of crystal samples for characterizations.

One wafer was cut from the middle of each crystal boule. A few of specimens of 2 mm×2 mm×0.25 mm with {001} orientation on each basal surface were made and electroded on the 2 mm×2 mm surfaces. Crystal specimens were poled under 3.5 kV/cm at 20° C. Test results are summarized in the Table V.

TABLE V

Summary of Experiment 5

| Crucible No. | No. 1 | No. 2 | No. 3 | No. 4 | No. 5 | No. 6 |
|---|---|---|---|---|---|---|
| Dopant | Yb | Sc | In | Sb | Co | Tm |
| Molar %* | 8% | 8% | 8% | 15% | 10% | 10% |
| $d_{33}$ pC/N | 1700 | 1950 | 1430 | 1220 | 1640 | 1700 |
| $K_3^T$ | 4700 | 5100 | 4200 | 3850 | 5200 | 5325 |
| Tc, ° C. | 183 | 178 | 181 | 193 | 166 | 168 |
| Structure** | R | R | R | T | R | R |

*The molar ratio based on Formula II; $((1 - y) \text{ Pb}(\text{Mg}_{1/3}\text{Nb}_{2/3})_{0.69}\text{Ti}_{0.31}\text{O}_3 + y\text{Pb}(\text{R}_{1/2}\text{Nb}_{1/2})\text{O}_3$ (described above), wherein y is defined as the molar % and R: Sc, Yb, Sn, In, Co, Lu, and Tm.)
**R: Rhombohedral, T: Tetragonal

Experiment 6

A typical Bridgman growth of PMN-32% PT crystal was performed. The growth conditions were similar with those used in Experiment No. 4. To compare the segregation effect between the present invented method (a hybrid Stockbarger Zone-leveling melting method) and the typical Bridgman method. An ICP analysis was performed on two crystals, the first crystal was that shown in FIG. 6 for the invented method, and the second crystal was grown by the typical Bridgman method. The composition of each crystal was tested along its length using an ICP (Induction Coupled Plasma) analysis.

Figure 8:
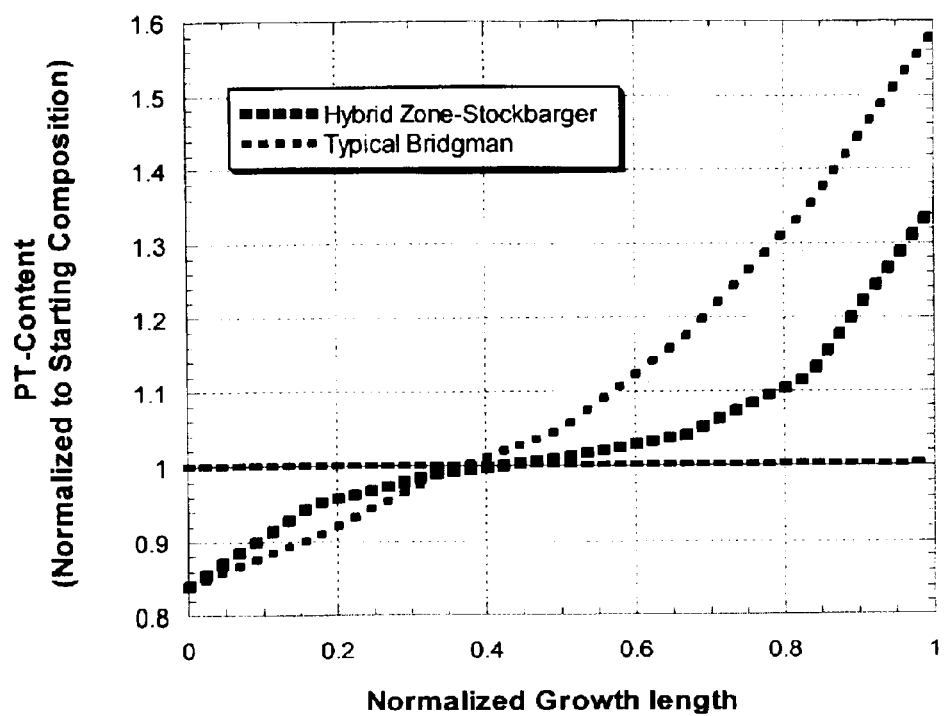
FIG. 8 is a graph showing the improvement of compositional homogeneity along growth length according one embodiment of the present invention.

Referring now to FIG. 8, where the results of the compositional variability along each crystal are shown. Analysis of the results clearly shows the following:

(A) both methods showed a beginning effective segregation coefficient close to 0.85, and (B) even while allowing for a +/−10% PT-content variation, a comparison of the useful portion of each boule (a segment with composition variation within +/−10% of the goal PT-content) shows that the as-grown crystal employing the present invention (Hybrid Stockbarger-Zone method) gains an impressive 44% in useful length for the invention over the typical Bridgman growth method.

This means that (i) the significant increase in the useful length of the boule allows substantial production and quality gains to be made, and consequently reduces the per-unit cost of each piezoelectric element produced therefrom, and (ii) the property homogeneity in a single crystal wafer is also significant improved, which would benefit all the applications of the PMN-PT crystal in the acoustic transducers.

In all, the physical properties of PMN-PT crystals grown by the system of the present invention are generally summarized and reflected in Table V below. While the formation techniques, test methods, and instruments are not noted herein, the formation techniques and compositions matched those of the invention described above. The test methods and instruments matched those commonly known in the art.

TABLE VI

| Parameters | PMN-PT (PT x = 0.27~0.32) |
|---|---|
| $K_{33}^T$ (1 KH) @ 20 C. | 4500~7000 |
| $K_{33}^S$ (Clamped) @ 20 C. | 900 |
| Dispassion tanδ (1 KH) | <0.005 |
| $d_{33}$ (pC/N) (150 H, 0.3 N) | 1500~3000 |
| $g_{33}$ ($10^{-3}$ Vm/N) | 45~55 |
| Coupling Coefficient $k_{33}$ | 0.9~0.94 |
| Strain @ 10 kV/cm | 0.1%~0.15% |
| $Y_{33}^E$ (GPa) | 20~25 |
| Depolarization Temperature (° C.) | ~90 |
| $E_c$ (V/mm) | 250~280 |
| Thermal Conductivity (W/cm.K) | 0.0026 |
| Thermal Expansion Coefficient ($10^{-6}$/° C.) 0~60° C. | 9.6 |

Experiment 7

In order to more fully understand the improvement provided by the present invention, the following experiment was conducted. Two cylinder specimens with <001> as a cylinder axis were cut from the PMN-PT crystal of FIG. 6. The crystal boule is 140 mm long. A specimen A was cut from a position 40 mm away from the seed bottom of the boule, and a specimen B was taken from a position 110 mm away from the seed bottom.

Specimens A and B were pooled under 3.5 kV/cm at room temperature and aged for 24 hours. For each specimen, a temperature dependence of dielectric constant was analyzed on an HP-4192A Impedance Analyzer associated with a furnace equipped with a programmable temperature controller. Piezoelectric coefficient $d_{33}$ was measured on a Berlincout meter for each specimen.

Figure 9A:
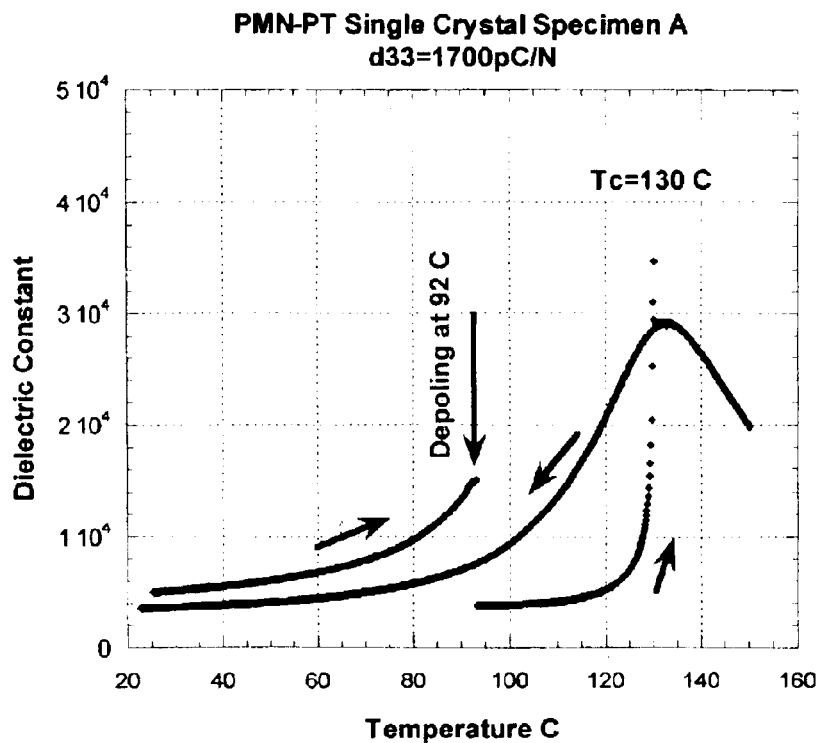
FIG. 9(A) is a graph showing the temperature dependence of dielectric constant for a PMN-PT crystal poling along <001>, parallel to a cylinder axis, for Specimen A.
Figure 9B:
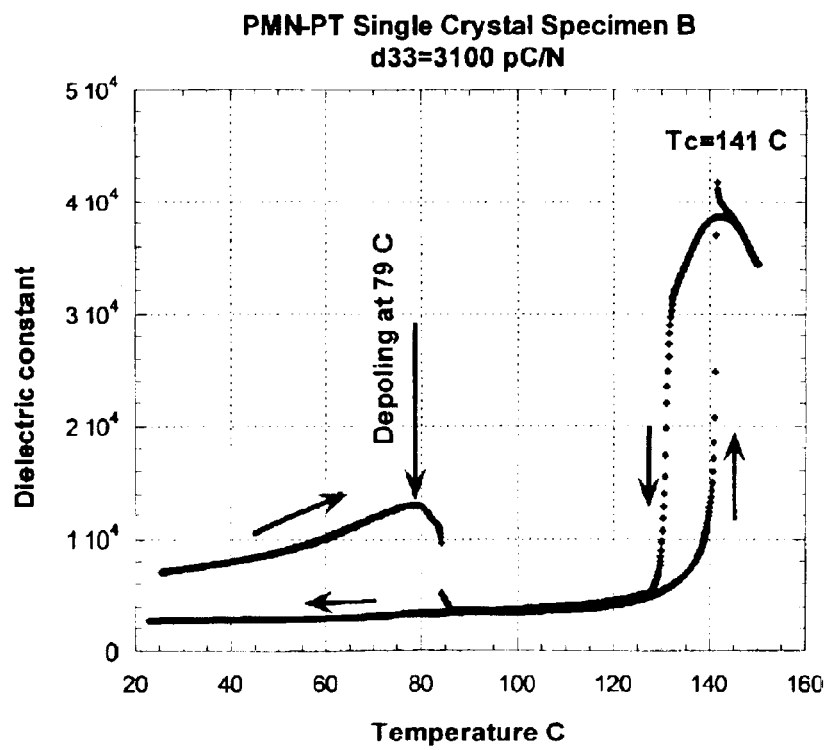
FIG. 9(B) is a graph showing the temperature dependence of dielectric constant for a PMN-PT crystal poling along <001>, parallel to a cylinder axis, for Specimen B.

Referring now to FIGS. 9(A) and 9(B), the results are given in a graphic form. The physical parameters for specimens A and B are summered in the table VII.

TABLE VII

| Parameters | Specimen A PT~28% | Specimen B PT~33% |
|---|---|---|
| Dielectric constant 20 C. 1 kH | 5100 | 6900 |
| Piezoelectric coefficient $d_{33}$, pC/N | 1700 | 3100 |
| Electromechanical coupling, $k_{33}$ | 0.90 | 0.94 |

TABLE VII-continued

| Parameters | Specimen A PT~28% | Specimen B PT~33% |
|---|---|---|
| Tc, Cubic to Tetragonal ° C. | 130 | 141 |
| Depoling temperature ° C. | 92 | 79 |

The depoling temperature is the maximum operating temperature for a transducer, which is critical for most commercial applications. The sample B depoling at 79° C., and located at location 110 mm from the crystal boule bottom (total boule being 140 mm long) indicates that more than 70% (110 mm/140 mm=78%) of the as grown crystal boule is suitable for a broad range of commercial and medical applications. This may also be discussed as a commercial yield of 70%.

The physical properties of the PMN-PT single crystals grown by the Hybrid Stockbarger Zone-leveling method of the present invention are extremely useful commercially and substantially reproducible due to the three temperature zone method. It is clear that the piezoelectric properties of the PMN-PT single crystals grown by the invented method are quite good for applications involving acoustic transduction devices. The quality control and improved homogeneity of the present method provide substantial manufacturing costs savings.

In the claims, means- or step-plus-function clauses are intended to cover the structures described or suggested herein as performing the recited function and not only structural equivalents but also equivalent structures. Thus, for example, although a nail, a screw, and a bolt may not be structural equivalents in that a nail relies entirely on friction between a wooden part and a cylindrical surface, a screw's helical surface positively engages the wooden part, and a bolt's head and nut compress opposite sides of at least one wooden part, in the environment of fastening wooden parts, a nail, a screw, and a bolt may be readily understood by those skilled in the art as equivalent structures.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

What is claimed is:

1. A crystal growth system, comprising:
a triple-zone temperature chamber co-axially containing a crucible assembly, having at least three growth sections separated from said temperature chamber by at least two baffles and having sufficient separation therefrom to allow movement there-through during a use;
at least one high temperature heating elements; and
means for controllably moving said crucible assembly within said triple-zone chamber during said use.

2. A transducer, formed by a method of forming a crystalline based material, comprising the steps of:
providing a precursor material;
loading at least said precursor material into at least one crucible;
placing said now-loaded crucible into a rigid ceramic member;
filling a space formed between said crucible and said ceramic member with at least one powdered ceramic and forming a crucible assembly;
providing a vertical furnace assembly containing at least a narrow high-temperature zone, an upper low-temperature zone, and a lower low-temperature zone, wherein said low-temperature zones are adjacent respective thermal boundaries and each have a negative thermal gradient vertically bounding said high-temperature zone;
inserting each said crucible assembly into said furnace assembly and positioning each said crucible assembly on a means for positioning said crucible relative to said high-temperature zone;
providing a means for controlling said crucible assembly, said furnace assembly, and said means for positioning;
operating said furnace assembly and forming an as-grown crystalline material in said crucible at a rate from 0.2 to 2.5 mm/hr;
maintaining a temperature gradient at a growth interface in said crucible adjacent said high-temperature zone of from 10° C./cm to about 40° C./cm during said step of operating to form said crystalline material;
said transducer comprising:
said precursor material includes a PMN-PT-based material;
a single crystal element material having the following chemical formula:

$(1-y)Pb(Mg_{1/3}Nb_{2/3})_{1-x}Ti_xO_3 + yPb(R_{1/2}Nb_{1/2})O_3$ wherein x is defined as molar % 0.00 to 0.50, y is defined as molar % 0.00 to 0.25, and R is selected from Sc, Yb, Sn, In, Co, Lu, and Tm.

3. A transducer, according to claim 2, wherein said transducer has a chemical formula according to formula VII and an effective Tc ° C. of greater than 176° C. in use.

4. A PMN-PT based material, comprising:
a single crystal; and
said single crystal having a formula:

$(1-y)Pb(Mg_{1/3}Nb_{2/3})_{1-x}Ti_xO_3 + yPb(R_{1/2}Nb_{1/2})O_3$ (IX)

wherein x is defined as molar % 0.00 to 0.50, y is defined as molar % 0.00 to 0.25, and R is selected from Sc, Yb, Sn, In, Co, Lu, and Tm.

5. A PMN-PT based material, according to claim 4, wherein: said single crystal element has at least one of a <001>, <110>, and <111> orientation.

6. A PMN-PT based material, according to claim 5, wherein and said single crystal has a $T_c$ at least from 5 to 10% higher than known PMN-PT crystalline materials.

* * * * *